(12) United States Patent
Ng et al.

(10) Patent No.: US 11,527,459 B2
(45) Date of Patent: Dec. 13, 2022

(54) SUBSTRATES FOR SEMICONDUCTOR PACKAGES, INCLUDING HYBRID SUBSTRATES FOR DECOUPLING CAPACITORS, AND ASSOCIATED DEVICES, SYSTEMS, AND METHODS

(71) Applicant: Micron Technology, Inc., Boise, ID (US)

(72) Inventors: Hong Wan Ng, Singapore (SG); Chin Hui Chong, Singapore (SG); Hem P. Takiar, Fremont, CA (US); Seng Kim Ye, Singapore (SG); Kelvin Tan Aik Boo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/243,466

(22) Filed: Apr. 28, 2021

(65) Prior Publication Data

US 2022/0352052 A1 Nov. 3, 2022

(51) Int. Cl.
| | | |
|---|---|---|
| *H01L 29/76* | (2006.01) | |
| *H01L 29/00* | (2006.01) | |
| *H01L 23/48* | (2006.01) | |
| *H01L 27/08* | (2006.01) | |
| *H01L 49/02* | (2006.01) | |
| *H01L 23/498* | (2006.01) | |

(52) U.S. Cl.
CPC ...... *H01L 23/481* (2013.01); *H01L 23/49816* (2013.01); *H01L 27/0805* (2013.01); *H01L 28/40* (2013.01)

(58) Field of Classification Search
CPC ............. H01L 23/481; H01L 23/49816; H01L 27/0805; H01L 28/40
USPC .......................................................... 257/532
See application file for complete search history.

(56) References Cited

U.S. PATENT DOCUMENTS

2014/0042607 A1* 2/2014 Knickerbocker ....... H01L 23/50
   438/26
2018/0286780 A1* 10/2018 Qi ........................... H01L 25/16

* cited by examiner

*Primary Examiner* — Theresa T Doan
(74) *Attorney, Agent, or Firm* — Perkins Coie LLP

(57) ABSTRACT

Substrates for semiconductor packages, including hybrid substrates for decoupling capacitors, and associated devices, systems, and methods are disclosed herein. In one embodiment, a substrate includes a first pair and a second pair of electrical contacts on a first surface of the substrate. The first pair of electrical contacts can be configured to receive a first surface-mount capacitor, and the second pair of electrical contacts can be configured to receive a second surface-mount capacitor. The first pair of electrical contacts can be spaced apart by a first space, and the second pair of electrical contacts can be spaced apart by a second space. The first and second spaces can correspond to first and second distances between electrical contacts of the first and second surface-mount capacitors.

9 Claims, 7 Drawing Sheets

SUBSTRATES FOR SEMICONDUCTOR PACKAGES, INCLUDING HYBRID SUBSTRATES FOR DECOUPLING CAPACITORS, AND ASSOCIATED DEVICES, SYSTEMS, AND METHODS

TECHNICAL FIELD

The present disclosure generally relates to semiconductor devices. In particular, the present technology relates to substrates for semiconductor packages, including hybrid substrates for decoupling capacitors, and associated devices, systems, and methods.

BACKGROUND

Capacitors are passive electrical components commonly used in circuits. Many circuits employ capacitors to suppress noise in power supply signals. Such capacitors are called decoupling or bypass capacitors and are typically connected between the power supply and ground. In operation, a decoupling capacitor acts as a small, local power supply for a circuit. For example, if a voltage drop occurs in power supply signals provided to the circuit, the decoupling capacitor can briefly supply power at the correct voltage to the circuit. In other words, the decoupling capacitor helps remove voltage fluctuations in power supply signals provided to the circuit. The decoupling capacitor therefore can protect components (e.g., integrated circuits) of the circuit that can be harmed or otherwise affected by voltage fluctuations in the power supply signals and/or can increase the likelihood of the circuit functioning as intended.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

A. Overview

Figure 1:
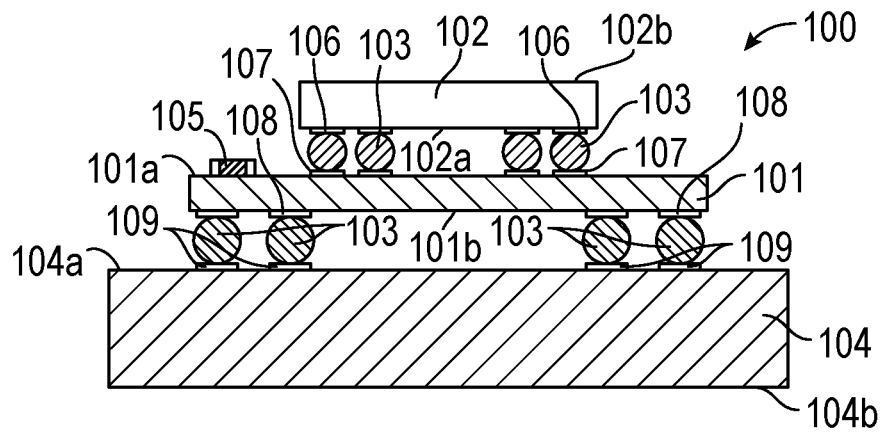
FIG. 1 is a side view of a semiconductor device configured in accordance with various embodiments of the present technology.

The following disclosure describes hybrid substrates for semiconductor packages. For the sake of clarity and understanding, embodiments of the present technology are discussed in detail below with respect to hybrid substrates for decoupling capacitors, such as decoupling capacitors incorporated into semiconductor packages for mobile or automobile applications. A person of ordinary skill in the art will readily appreciate, however, that other applications and other embodiments in addition to those described herein are within the scope of the present technology. For example, hybrid substrates (and associated systems, devices, and methods) of the present technology can be used for other (e.g., non-decoupling) capacitors and/or other (e.g., non-capacitor) electrical components, such as other passive components (e.g., resistors, inductors, etc.) of a circuit. Additionally, or alternatively, hybrid substrates (and associated systems, devices, and methods) of the present technology can be employed in contexts other than mobile and automobile applications, such as in appliance or imaging devices. Such other applications, embodiments, and/or contexts are within the scope of the present technology.

As discussed above, decoupling capacitors can be employed in circuits to suppress noise in power supply signals. For example, decoupling capacitors can be employed in a power delivery network of a semiconductor device (e.g., a volatile or non-volatile memory device) to remove voltage fluctuations from power supply signals provided to components of the semiconductor device. As a specific example, decoupling capacitors can be used in managed NAND (mNAND) flash memory devices to remove voltage fluctuations from power supply signals provided to a controller and/or a memory component of the device.

The specific decoupling capacitors employed can depend at least in part on the end application of the semiconductor device. For example, decoupling capacitors having a smaller footprint (e.g., 0201 capacitors) are often used in semiconductor devices for mobile applications. On the other hand, decoupling capacitors having larger footprints (e.g., 0402 capacitors) are often used in semiconductor devices for automotive applications (e.g., to meet reliability requirements imposed by the industry, such as AEC-Q200 that specifies stress test qualifications for passive electrical components employed in the automotive industry).

The different footprints of the differently-sized capacitors require different substrate layouts. As a result, a separate substrate is commonly manufactured for each of the decoupling capacitor footprints. In other words, substrates are commonly manufactured for use with decoupling capacitors of only a single size and/or footprint. Thus, substrates designed for use with only decoupling capacitors having the smaller footprint (e.g., substrates designed for mobile applications) cannot be used in the automotive industry that require larger decoupling capacitors with larger footprints. Similarly, substrates designed for using with only decoupling capacitors having the larger footprint (e.g., substrates designed for automotive applications) cannot employ smaller decoupling capacitors with smaller footprints for use in mobile applications.

To address these concerns, the inventors having developed hybrid substrates that can support capacitors with different footprints. In one embodiment, a substrate includes a first set of electrical contacts and a second set of electrical contacts. The electrical contacts can be bond pads or other suitable electrical contacts. The electrical contacts of the first set can be separated by a first space. The first space can correspond at least in part to a first distance between electrical capacitor contacts of a first capacitor. Similarly, the electrical contacts of the second set can be separated by a second space. The second space can correspond at least in part to a second distance between electrical capacitor contacts of a second capacitor. In some embodiments, the second capacitor has a smaller footprint than the first capacitor. Therefore, in these embodiments, the second distance can be smaller than the first distance, and/or the second space can be smaller than the first space.

In some embodiments, the first capacitor can be positioned over (e.g., on) the substrate and electrically coupled to the first set of electrical contacts. Additionally, or alternatively, the second capacitor can be positioned over (e.g., on) the substrate and electrically coupled to the second set of electrical contacts. Thus, the substrate can be a hybrid substrate that is configured to receive the first capacitor and/or the second capacitor. In other words, the same substrate can be employed (i) in semiconductor packages for markets (e.g., the automotive markets) using the larger, first capacitor, and (ii) in semiconductor packages for markets (e.g., the mobile markets) using the smaller, second capacitor. This can (i) enable high volume manufacturing of the substrate and/or of semiconductor devices incorporating the substrate and (ii) obviate the practice of manufacturing separate substrates for different markets.

Specific details of several embodiments of the present technology are described herein with reference to FIGS. 1-8. It should be noted that other embodiments in addition to those disclosed herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "horizontal," "upper," "lower," "top," "above," "left," "right," "below," and "bottom" can refer to relative directions or positions of features in the semiconductor devices in view of the orientation shown in FIGS. 1-8. For example, "bottom" and/or "below" can refer to a feature positioned closer to the bottom of a page than another feature. These terms, however, should be construed broadly to include semiconductor devices having other orientations, such as inverted or inclined orientations where top/bottom, over/under, above/below, up/down, and/or left/right can be interchanged depending on the orientation. Furthermore, the terms "connect" and "couple" are used interchangeably herein and refer to both direct and indirect connections or couplings. For example, where the context permits, element A "connected" or "coupled" to element B can refer (i) to A directly "connected" or "coupled" to B and/or (ii) to A indirectly "connected" or "coupled" to B.

B. Selected Embodiments of Hybrid Substrates, Including Hybrid Substrates for Decoupling Capacitors, and Associated Systems, Devices, and Methods FIG. 1 is a side view of a semiconductor device 100 ("the device 100") configured in accordance with various embodiments of the present technology. As shown, the device 100 includes a substrate 101, a semiconductor die 102, a printed circuit board 104 ("the PCB 104"), and a capacitor 105. In some embodiments, the device 100 can be provided as part of a larger system. For example, the device 100 can be provided as part of a system (e.g., a computing system or another component) of a mobile device, an automotive device, and/or another device or system.

As shown in FIG. 1, the semiconductor die 102 includes an active side 102a (e.g., an active surface or an active face) having a plurality of electrical contacts 106. The electrical contacts 106 can be bond pads and/or other suitable electrical contacts. The semiconductor die 102 of FIG. 1 is positioned over (e.g., on top of) the substrate 101 and is illustrated in a face-down orientation. In other embodiments, the semiconductor die 102 can be arranged in a face-up orientation, and/or the semiconductor die 102 can include one or more electrical contacts (not shown) on a side 102b (e.g., on a surface or on a face) opposite the active side 102a of the memory die 102.

The semiconductor die 102 can include various types of semiconductor components and functional features, such as dynamic random-access memory (DRAM), static random-access memory (SRAM), flash (e.g., NAND or NOR) memory, or other forms of integrated circuit memory, processing circuitry, imaging components, and/or other semiconductor features. In one embodiment, the semiconductor die 102 is a memory die. Additionally, or alternatively, the semiconductor die 102 can embody a variety of alternative integrated circuit functions. Furthermore, although only one semiconductor die 102 is included in the embodiment illustrated in FIG. 1, semiconductor devices configured in accordance with other embodiments of the present technology can include a greater number (e.g., more than one) of semiconductor dies 102. The plurality of semiconductor dies 102 can be arranged side-by-side on the substrate 101, and/or the semiconductor dies 102 can be stacked such that at least one of the semiconductor dies 102 is placed on top of another of the semiconductor dies 102.

In the embodiment illustrated in FIG. 1, the PCB 104 includes a first side 104a (e.g., a first surface or a first face) and a second side 104b (e.g., a second surface or a second face). A plurality of electrical contacts 109 are disposed on or in the first side 104a of the PCB 104. The electrical contacts 109 can be bond pads and/or other suitable electrical contacts. Although not shown in FIG. 1, the PCB 104 further includes a network (not shown) of electrical connectors (e.g., conductive traces, wires, printed conductive lines, etc.) configured to electrically couple the substrate 101, the semiconductor die 102, and/or the capacitor 105 to other components (a controller, a processor, and/or other components) of a system incorporating the device 100.

The substrate 101 of FIG. 1 includes a first side 101a (e.g., a first surface or a first face) and a second side 101b (e.g., a second surface or a second face). A plurality of electrical contacts 107 are disposed on or in the first side 101a of the substrate 101, and a plurality of electrical contacts 108 are disposed on or in the second side 101b of the substrate 101. The electrical contacts 107 and/or the electrical contacts 108 can be bond pads and/or other suitable electrical contacts. The substrate 101 further includes a network (not shown) of electrical connectors (e.g., conductive traces, wires, printed conductive lines, etc.) configured to electrically couple the semiconductor die 102, the capacitor 105, and/or the PCB 104 to one another.

In the illustrated embodiment, the substrate 101 is shown positioned between the semiconductor die 102 and the PCB 104. A plurality of electrical connectors 103 (e.g., solder balls, conductive pillars, and/or other suitable electrical connectors, such as wire bonds) can be used (i) to electrically couple the electrical contacts 106 on the active side 102a of the semiconductor die 102 to respective ones of the plurality of electrical contacts 107 on the first side 101a of the substrate 101, and/or (ii) to electrically couple the electrical contacts 108 on the second side 101b of the substrate 101 to respective ones of the plurality of electrical contacts 109 on the first side 104a of the PCB 104. This can facilitate electrical communication between the semiconductor die 102 and the PCB 104 via the substrate 101 and/or the capacitor 105.

As discussed in greater detail below with respect to FIGS. 2A-7, the substrate 101 can be a hybrid substrate designed for use with capacitors (e.g., decoupling capacitors, surface-mount capacitors, etc.) and/or other passive electrical components (e.g., resistors, inductors, non-decoupling capacitors, etc.) having different footprints. As shown in FIG. 1, the capacitor 105 is mounted to the first side 101a of the substrate 101. For example, the capacitor 105 can be positioned on top of and/or placed in electrical communication with electrical contacts (not shown in FIG. 1) on the first side 101a of the substrate 101. The electrical contacts on the first side 101a of the substrate 101 are discussed in greater detail below with respect to FIGS. 2A-7. In these and other embodiments, the semiconductor device 100 can include a capacitor 105 positioned at other locations on the substrate 101 (e.g., on the second side 101b, on the first side 101a but on the opposite side of the semiconductor die 102, etc.), and/or the capacitor 105 can be placed in electrical communication with other electrical contacts (not shown) of the substrate 101. In some embodiments, the device 100 can include a greater number (e.g., more than one) of capacitors 105, and the substrate 101 can include a corresponding number of electrical contacts.

As discussed above, the substrate 101 can place the capacitor 105 in electrical communication with the PCB 104 and/or with the semiconductor die 102. In one embodiment, the capacitor 105 is employed in an electrical circuit between a high voltage (e.g., a power supply voltage $V_{CC}$, $V_{CCQ}$, or $V_{CCQ2}$) and a low voltage (e.g., a ground voltage $V_{SS}$) of the semiconductor die 102 to decouple the high voltage input from the low voltage input. For example, the capacitor 105 can be employed to connect (i) a first branch of the electrical circuit that is energized to the high voltage input to (ii) a second branch of the electrical circuit that is energized to the low voltage input. Continuing with this example, the capacitor 105 can serve as a decoupling capacitor that filters power supply signals provided to the semiconductor die 102 and/or that acts as a surge/spike suppressor for the semiconductor die 102.

Figure 2A:
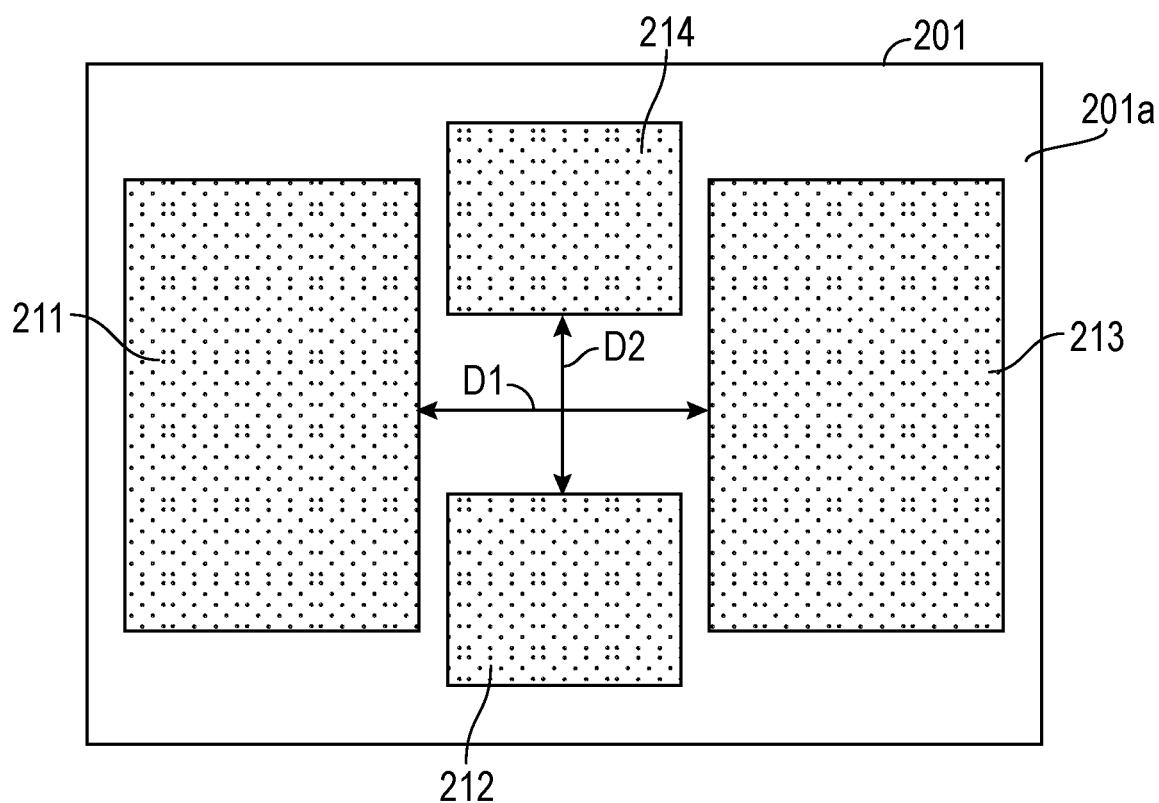
FIGS. 2A and 2B are a top view and a cross-sectional side view, respectively, of a substrate configured in accordance with various embodiments of the present technology.
Figure 2B:
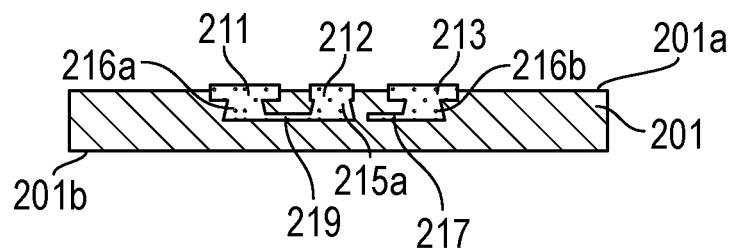

FIG. 2A is a top view of a substrate 201 (e.g., of the substrate 101 of FIG. 1) configured in accordance with various embodiments of the present technology, and FIG. 2B is a side cross-sectional view of the substrate 201. Referring to FIG. 2A, the substrate 201 includes a plurality of electrical contacts 211-214 disposed on, formed on or in, and/or exposed through a first side or surface 201a of the substrate 201. The electrical contacts 211-214 can be bond pads and/or other suitable electrical contacts. In the illustrated embodiment, the electrical contacts 211 and 213 have a same or similar size to one another. Additionally, the electrical contacts 212 and 214 have a same or similar size to one another but a different (e.g., smaller) size from the size of the electrical contacts 211 and 213. In other embodiments, the sizes of the electrical contacts 211-214 can be uniform, can vary, and/or can differ from one another. In some embodiments, the electrical contacts 211-214 can be solder mask defined or non-solder mask defined.

The electrical contacts 211 and 213 can form a set or pair. This set of electrical contacts 211 and 213 can correspond to a capacitor (e.g., the capacitor 105 of FIG. 1 or another capacitor) having a footprint of a first (larger) size. For example, the electrical contacts 211 and 213 of FIG. 2A are separated by a first space that is defined at least in part by a distance D1 between the electrical contacts 211 and 213. The first space can correspond at least in part to a first distance between electrical capacitor contacts of a capacitor (e.g., a 0402 capacitor) having the footprint of the first size.

The electrical contacts 212 and 214 can form another set or pair. This other set of electrical contacts 212 and 214 can correspond to a capacitor (e.g., the capacitor 105 of FIG. 1 or another capacitor) having a footprint of a second (smaller) size. For example, the electrical contacts 212 and 214 of FIG. 2A are separated by a second space that is defined at least in part by a distance D2 between the electrical contacts 212 and 214. The second space can correspond at least in part to a second distance between electrical capacitor contacts of a capacitor (e.g., a 0201 capacitor) having the footprint of the second size.

The electrical contacts 212 and 214 can be positioned between the electrical contacts 211 and 213. In these and other embodiments, the electrical contacts 212 and 214 can be positioned at least in part within the footprint of or the first space separating the electrical contacts 211 and 213. For example, the electrical contacts 212 and 214 in FIG. 2A are positioned such that a portion of a first capacitor (when the first capacitor is electrically connected to the electrical contacts 211 and 213) is at least partially positioned over and/or is at least partially positioned between the electrical contacts 212 and 214. Stated another way, the electrical contacts 212 and 214 can be positioned such that a portion of a second capacitor (when the second capacitor is electrically connected to the electrical contacts 212 and 214) is positioned at least partially between the electrical contacts 211 and 213. Such an arrangement of the electrical contacts 211-214 can reduce and/or minimize the overall footprint of the electrical contacts 211-214 on the substrate 201.

In some embodiments, each of the electrical contacts 211-214 can be electrically connected to one of various voltages. For example, the electrical contacts 211 and/or 212 can be connected to a power supply voltage $V_{CC}$, $V_{CCQ}$, or $V_{CCQ2}$. In these and other embodiments, the electrical contacts 213 and/or 214 can be connected to a ground voltage $V_{SS}$. In these and still other embodiments, the electrical contacts 211 and/or 212 can be connected to a ground voltage $V_{SS}$, and/or the electrical contacts 213 and/or 214 can be connected to a power supply voltage $V_{CC}$, $V_{CCQ}$, or $V_{CCQ2}$. In a specific example, the electrical contacts 211 and 212 are connected to the power supply voltage $V_{CCQ}$, and the electrical contacts 213 and 214 are connected to the ground voltage $V_{SS}$.

In some embodiments, some of the electrical contacts 211-214 can be electrically coupled to one another. For example, the electrical contact 211 can be electrically coupled to the electrical contact 212, and/or the electrical contact 213 can be electrically coupled to the electrical contact 214. Continuing with this example, one or more electrical connectors can be used to electrically couple the electrical contact 211 to the electrical contact 212. Referring to FIG. 2B, the electrical connectors can include (i) a via 216a (e.g., a through substrate via (TSV)) extending into the substrate 201 (e.g., generally towards a second side 201b of the substrate 201 and generally away from the first side 201a of the substrate 201) from the electrical contact 211, (ii) an electrical trace 219 extending generally laterally within the substrate 201 from the via 216a, and (iii) a via 215a (e.g., a TSV) extending into the substrate 201 (e.g., generally towards the second side 201b of the substrate 201 and generally away from the first side 201a of the substrate 201) from the electrical contact 212 to the trace 219. When the electrical contact 211 is electrically coupled to the electrical contact 212, the electrical contacts 211 and 212 can be electrically coupled to a same voltage (e.g., to a power supply voltage $V_{CC}$ or $V_{CCQ}$, or to a ground voltage $V_{SS}$).

Continuing with the above example, one or more electrical connectors can additionally or alternatively be used to electrically couple the electrical contact 213 to the electrical contact 214. Referring again to FIG. 2B, these electrical connectors can include (i) a via 216b (e.g., a TSV) extending into the substrate 201 (e.g., generally towards the second side 201b of the substrate 201 and generally away from the first side 201a of the substrate 201) from the electrical contact 213, (ii) an electrical trace 217 extending generally laterally within the substrate 201 from the via 216b, and (iii) a via (not shown in FIG. 2B) extending into the substrate 201 (e.g., generally towards the second side 201b of the substrate 201 and generally away from the first side 201a of the substrate 201) from the electrical contact 214 to the electrical trace 217. When the electrical contact 213 is electrically coupled to the electrical contact 214, the electrical contacts 213 and 214 can be electrically coupled to a same voltage (e.g., to a power supply voltage $V_{CC}$ or $V_{CCQ}$, or to a ground voltage $V_{SS}$).

Although vias and traces are shown in FIG. 2B electrically coupling the electrical contacts 211 and 213 to the electrical contacts 212 and 214, respectively, other electrical connectors can be used in other embodiments. For example, electrical traces or printed conductive lines can extend directly from the electrical contact 211 and/or the electrical contact 213 to the electrical contact 212 and/or the electrical contact 214, respectively, in some embodiments. In these embodiments, the electrical traces or printed conductive lines can be used in lieu of vias. As another example, one or more electrical connectors (e.g., wire bonds) that are not included within the substrate 201 can be used in addition to or in lieu of electrical traces and/or vias to electrically couple some of the electrical contacts 211-214 to others of the electrical contacts 211-214.

As still another example, the electrical contact 211 and the electrical contact 212 can be formed from or can comprise a common conductive pad. Continuing with this example, a single conductive pad can be disposed on or in the substrate 201 (e.g., on or proximate the first side 201a). A substrate layer (e.g., a solder mask layer) can be disposed over the single conductive pad, and openings in the solder mask layer can expose portions of the single conductive pad to define the electrical contact 211 and the electrical contact 212. A size of the openings and/or of the exposed portions of the single conductive pad can correspond to a size of electrical contacts on capacitors the electrical contact 211 or the electrical contact 212 are configured to receive. The electrical contacts 213 and 214 can additionally or alternatively be formed in a same or similar manner (e.g., using another single conductive pad disposed on or in the substrate 201).

Coupling some of the electrical contacts 211-214 to others of the electrical contacts 211-214 can reduce the number and/or overall footprint of electrical connectors coupled to the electrical contacts 211-214. For example, instead of using a set of electrical connectors (e.g., vias, traces, etc.) electrically coupled to the electrical contact 211 and a separate set of electrical connectors (e.g., vias, traces, etc.) electrically coupled to the electrical contact 212, the same set of electrical connectors can be electrically coupled to both the electrical contact 211 and the electrical contact 212. Similarly, instead of using a set of electrical connectors (e.g., vias, traces, etc.) electrically coupled to the electrical contact 213 and a separate set of electrical connectors (e.g., vias, traces, etc.) electrically coupled to the electrical contact 214, the same set of electrical connectors can be electrically coupled to both the electrical contact 213 and the electrical contact 214.

In other words, the electrical contacts 211 and 212 can be electrically connected to or positioned within a same branch of a circuit (e.g., a first circuit branch). Additionally, or alternatively, the electrical contacts 213 and 214 can be connected to or positioned within a same branch of a circuit (e.g., a second circuit branch). The first circuit branch and the second circuit branch can be portions of the same circuit. Thus, in some embodiments, regardless of whether a capacitor is electrically connected (a) to the electrical contact 211 and the electrical contact 213 or (b) to the electrical contact 212 and the electrical contact 214, the capacitor connects to the first branch of the circuit to the second branch of the circuit.

Figure 3A:
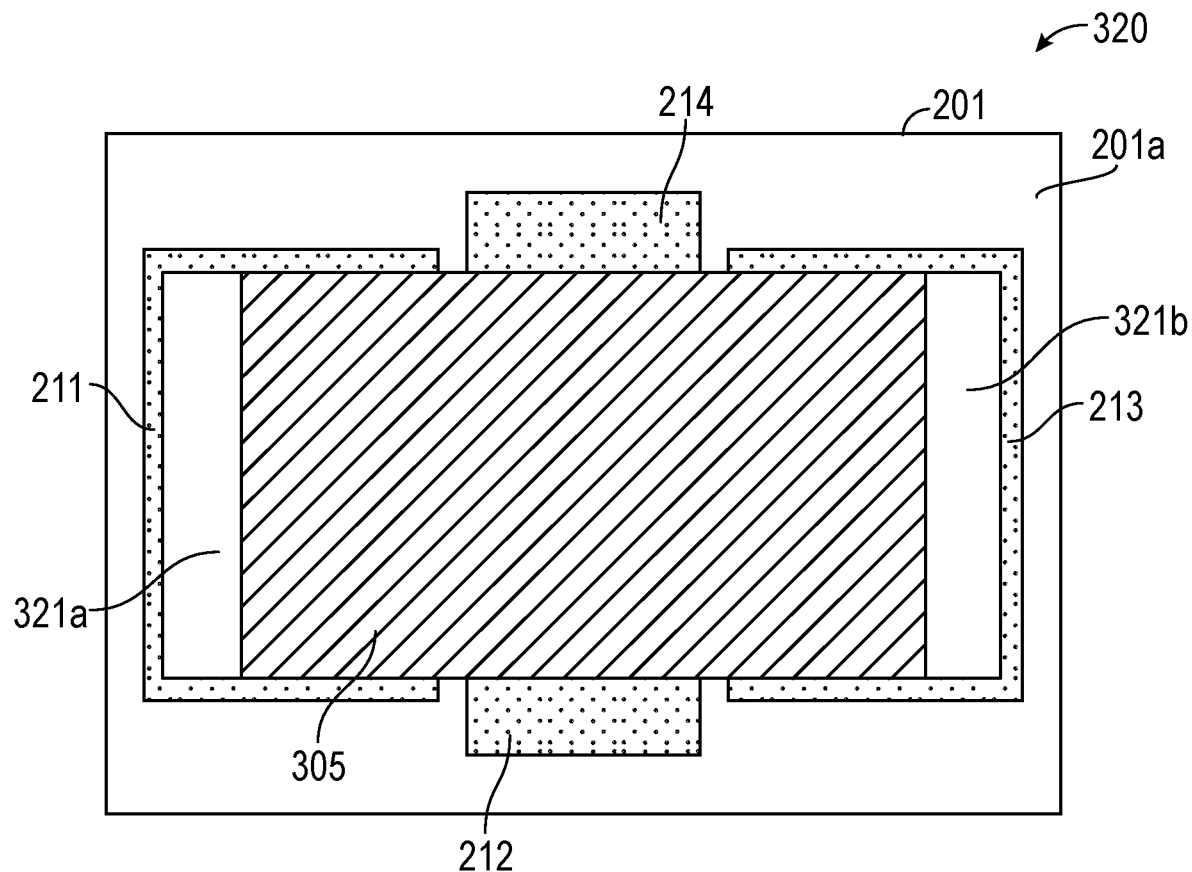
FIGS. 3A and 3B are a top view and a cross-sectional side view, respectively, of an arrangement including a capacitor positioned over the substrate of FIGS. 2A and 2B, in accordance with various embodiments of the present technology.
Figure 3B:
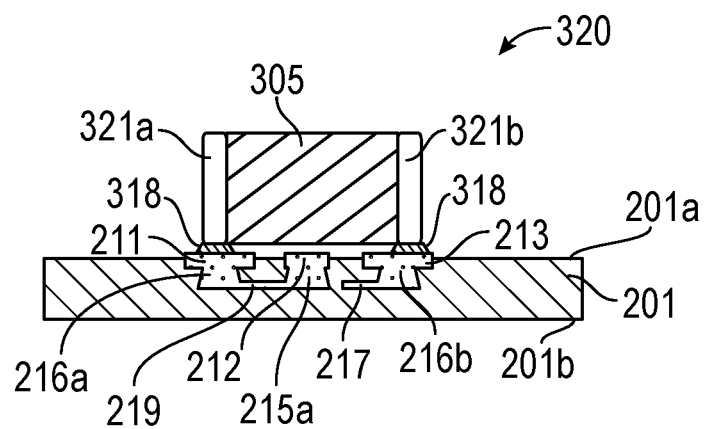

FIGS. 3A and 3B are a top view and a cross-sectional side view, respectively, of an arrangement 320 including a capacitor 305 positioned over (e.g., on) the substrate 201 of FIGS. 2A and 2B, in accordance with various embodiments of the present technology. The capacitor 305 can be the capacitor 105 of FIG. 1 or another capacitor. In some embodiments, the capacitor 305 can be a 0402 capacitor.

As shown, the capacitor 305 includes a first electrical capacitor contact 321a (e.g., a first electrical pin or terminal) and a second electrical capacitor contact 321b (e.g., a second electrical pin or terminal). The first electrical capacitor contact 321a is aligned with and electrically coupled to the electrical contact 211 of the substrate 201. An electrical connector 318 (FIG. 3B), such as a solder ball and/or another suitable electrical connector, can be used to facilitate the electrical connection between the first electrical capacitor contact 321a of the capacitor 305 and the electrical contact 211. Similarly, the second electrical capacitor contact 321b of the capacitor 305 is aligned with and electrically coupled to the electrical contact 213. Another electrical connector 318, such as a solder ball and/or another suitable electrical connector, can be used to facilitate the electrical connection between the electrical capacitor contact 321b of the capacitor 305 and the electrical contact 213. Thus, the capacitor 305 can be positioned in a first orientation (e.g., a generally horizontal or lateral orientation) on the substrate 201 in FIGS. 3A and 3B with at least a portion of the capacitor 305 positioned over and/or between at least a portion of the electrical contacts 212 and/or 214. In some embodiments, the capacitor 305 is a non-polarity device such that the first electrical capacitor contact 321a and the second electrical capacitor contact 321b can additionally or alternatively be electrically coupled to the electrical contact 213 and the electrical contact 211, respectively.

Due at least in part to the arrangement of the electrical contacts 211-214 on the first side 201a of the substrate 201 (e.g., due to the position of the electrical contact 212 and/or the electrical contact 214 at least partially between the electrical contacts 211 and 213), the capacitor 305 can occupy a space between the electrical contacts 211 and 213 as well as a space between the electrical contacts 212 and 214 when the capacitor 305 is positioned over the first side 201a of the substrate 201 and/or is electrically coupled (e.g., directly) to the electrical contacts 211 and 213. As a result, the electrical contacts 212 and 214 can be prevented from receiving a capacitor while the capacitor 305 is positioned over the first side 201a of the substrate 201 and/or is electrically coupled (e.g., directly) to the electrical contacts 211 and 213. Stated another way, a capacitor can be prevented from being positioned over the first side 201a of the substrate 201 and/or from being electrically coupled (e.g., directly) to the electrical contacts 212 and 214 at least while the capacitor 305 is installed on the substrate 201 as shown in FIG. 3A. Thus, in some embodiments, only one capacitor (e.g., a capacitor 305 electrically coupled to the electrical contacts 211 and 213, or a capacitor electrically coupled to the electrical contacts 212 and 214) can be installed over the first side 201a of the substrate 201 and electrically coupled (e.g., directly) to two of the electrical contacts 211-214 at a time.

In some embodiments, the capacitor 305 can be a decoupling capacitor. For example, the electrical contacts 211 and 212 can be electrically connected to a power supply voltage $V_{CCQ}$, and the electrical contacts 213 and 214 can be electrically connect to a ground voltage $V_{SS}$. Continuing with this example, when the capacitor 305 is electrically coupled to the electrical contacts 211 and 213, the capacitor 305 can decouple the power supply voltage $V_{CCQ}$ from the ground voltage $V_{SS}$ and thereby remove voltage fluctuations from the power supply signals.

Figure 4A:
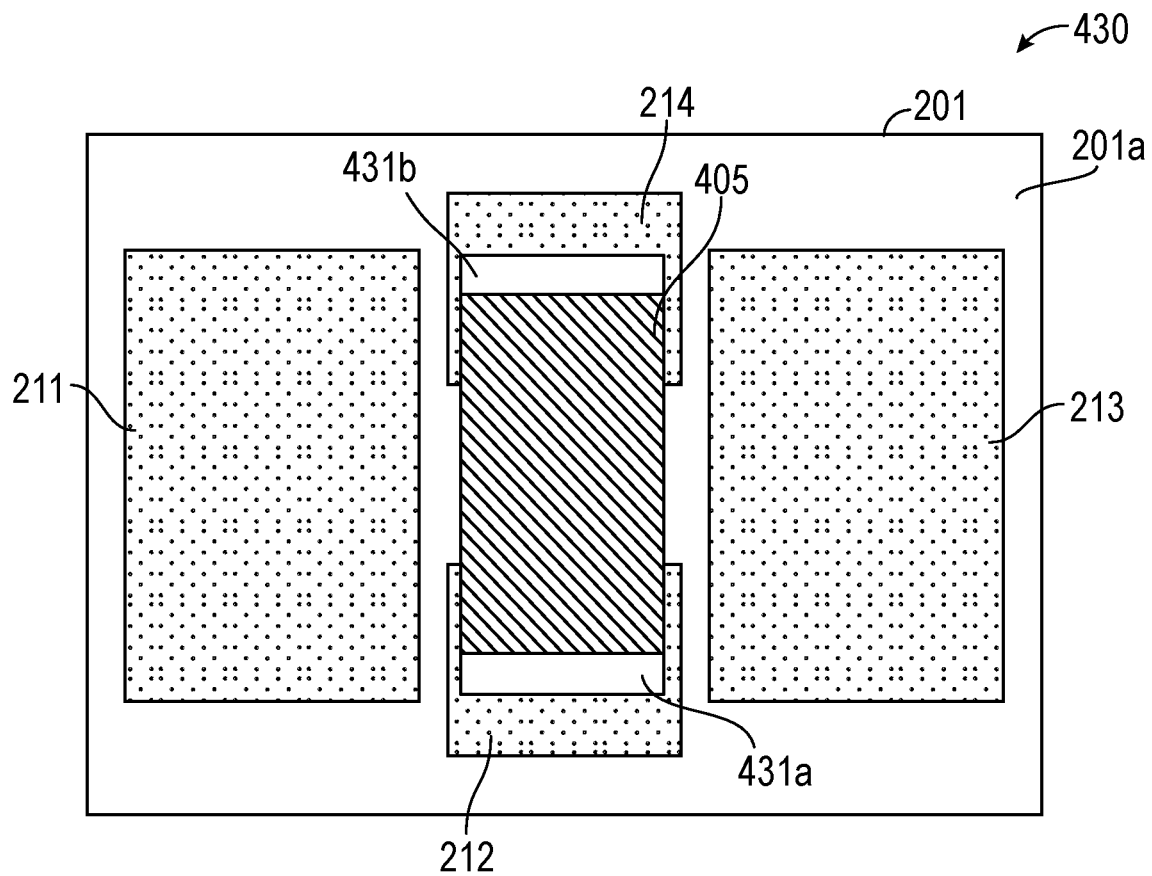
FIGS. 4A and 4B are a top view and a cross-sectional side view, respectively, of another arrangement including a capacitor positioned over the substrate of FIGS. 2A and 2B, in accordance with various embodiments of the present technology.
Figure 4B:
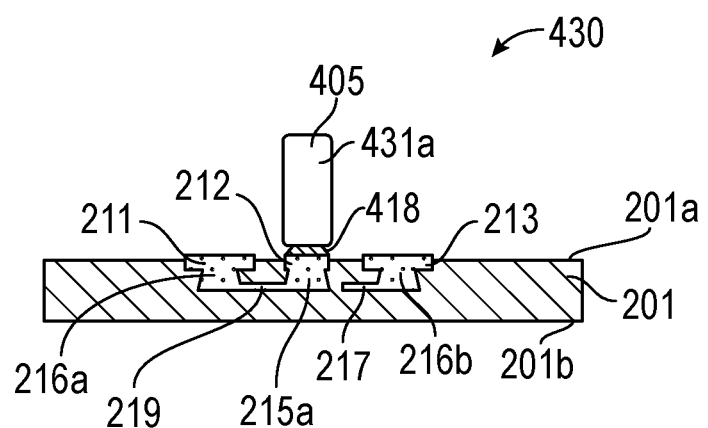

FIGS. 4A and 4B are a top view and a cross-sectional side view, respectively, of another arrangement 430 including a capacitor 405 positioned over (e.g., on) the substrate 201 of FIGS. 2A and 2B, in accordance with various embodiments of the present technology. The capacitor 405 can be the capacitor 105 of FIG. 1 or another capacitor. In some embodiments, the capacitor 405 can be a 0201 capacitor.

As shown, the capacitor 405 includes a first electrical capacitor contact 431a (e.g., a first electrical pin or terminal) and a second electrical capacitor contact 431b (e.g., a second electrical pin or terminal). The first electrical capacitor contact 431a is aligned with and electrically coupled to the electrical contact 212 of the substrate 201. An electrical connector 418 (FIG. 4B), such as a solder ball and/or another suitable electrical connector, can be used to facilitate the electrical connection between the first electrical capacitor contact 431a of the capacitor 405 and the electrical contact 212. Similarly, the second electrical capacitor contact 431b is aligned with and electrically coupled to the electrical contact 214. Another electrical connector (not shown), such as a solder ball and/or another suitable electrical connector, can be used to facilitate the electrical connection between the electrical capacitor contact 431b of the capacitor 405 and the electrical contact 214. In some embodiments, the capacitor 405 is a non-polarity device such that the first electrical capacitor contact 431a and the second electrical capacitor contact 431b can additionally or alternatively be electrically coupled to the electrical contact 214 and the electrical contact 212, respectively.

In contrast with the capacitor 305 of FIGS. 3A and 3B, the capacitor 405 of FIGS. 4A and 4B can be positioned in a second orientation (e.g., a generally vertical orientation) on the substrate 201 with at least a portion of the capacitor 405 positioned over and/or between at least a portion of the electrical contacts 211 and/or 213. Stated another way, the capacitor 405 can be positioned on the substrate 201 and electrically coupled to the electrical contacts 212 and 214 such that the capacitor 405 is positioned in an orientation generally perpendicular to the orientation of the capacitor 305 when the capacitor 305 is positioned on the substrate 201 and is electrically coupled to the electrical contacts 211 and 213.

In other embodiments, the electrical contacts 212 and 214 can be positioned at other locations on the first side 201a of the substrate 201 such that the capacitor 405 has a different orientation than shown in FIG. 4A when positioned on the substrate 201 and electrically coupled to the electrical contacts 212 and 214. For example, the electrical contacts 212 and 214 can be positioned at locations similar to where the electrical contacts 212 and 214 illustrated in FIG. 2A would be positioned if the electrical contacts 212 and 214 of FIG. 2A were rotated clockwise 90 degrees about a point positioned halfway between the electrical contacts 212 and 214 in FIG. 2A. In such a rotated arrangement, when the capacitor 405 is positioned on the substrate 201 and is electrically coupled to the electrical contacts 212 and 214, the capacitor 405 can be positioned in a third orientation (e.g., a generally horizontal orientation). The third orientation can be generally parallel to the orientation of the capacitor 305 (FIG. 3A) when the capacitor 305 is positioned on the substrate 201 and is electrically coupled to the electrical contacts 211 and 213. In some embodiments, at least a portion of the electrical contact 212 and/or at least a portion of the electrical contact 214 can remain between the electrical contacts 211 and 213 in the rotated arrangement. For example, the electrical contacts 212 and 214 can be positioned (e.g., entirely) within a footprint of the electrical contacts 211 and 213.

Due at least in part to the arrangement of the electrical contacts 211-214 (e.g., due to the position of the electrical contact 212 and/or the electrical contact 214 between the electrical contacts 211 and 213), the capacitor 405 can occupy a space between the electrical contacts 212 and 214 as well as a space between the electrical contacts 211 and 213 when the capacitor 405 is positioned over the first side 201a of the substrate 201 and/or is electrically coupled (e.g., directly) to the electrical contacts 212 and 214. As a result, the electrical contacts 211 and 213 can be prevented from receiving a capacitor (e.g., the capacitor 305 of FIGS. 3A and 3B) while the capacitor 405 is positioned over the first side 201a of the substrate 201 and/or is electrically coupled (e.g., directly) to the electrical contacts 212 and 214. Stated another way, a capacitor (e.g., the capacitor 305) can be prevented from being positioned over the first side 201a of the substrate 201 and/or from being electrically coupled (e.g., directly) to the electrical contacts 211 and 213 at least while the capacitor 405 is installed on the substrate 201 as shown in FIG. 4A. Thus, in some embodiments, only one capacitor (e.g., a capacitor 305 electrically coupled to the electrical contacts 211 and 213, or a capacitor 405 electrically coupled to the electrical contacts 212 and 214) can be installed over the first side 201a of the substrate 201 and electrically coupled (e.g., directly) to two of the electrical contacts 211-214 at a time.

In some embodiments, the capacitor 405 can be a decoupling capacitor. For example, the electrical contacts 211 and 212 can be electrically connected to a power supply voltage $V_{CCQ}$, and the electrical contacts 213 and 214 can be electrically connected to a ground voltage $V_{SS}$. Continuing with this example, when the capacitor 405 is electrically coupled to the electrical contacts 212 and 214, the capacitor 405 can decouple the power supply voltage $V_{CCQ}$ from the ground voltage $V_{SS}$ and thereby remove voltage fluctuations from the power supply signals.

Thus, the substrate 201 of FIGS. 2A-4B is a hybrid substrate that can be used with a capacitor 305 having a larger footprint and/or with a capacitor 405 having a smaller footprint. For example, the electrical contacts 211 and 213 can be used with the capacitor 305, and the electrical contacts 212 and 214 can be used with the capacitor 405. In other words, the same substrate 201 can be used for markets (e.g., automotive) that use capacitors (e.g., the capacitor 305 of FIGS. 3A and 3B) having larger footprints, as well as for markets (e.g., mobile) that use capacitors (e.g., the capacitor 405 of FIGS. 4A and 4B) having smaller footprints. This can (i) enable high volume manufacturing of the substrate 201 and/or of semiconductor devices (e.g., the semiconductor device 100 of FIG. 1) incorporating the substrate 201 and (ii) obviate the practice of manufacturing separate substrates for the different markets.

Although shown with a single instance of the electrical contacts 211-214, substrates 201 configured in accordance with other embodiments of the present technology can include multiple instances of the electrical contacts 211-214. For example, a substrate 201 configured in accordance with other embodiments of the present technology can include a first instance of the electrical contacts 211-214 in the arrangement illustrated in FIGS. 2A-4B and a second, separate instance of the electrical contacts 211-214 in the arrangement illustrated in FIGS. 2A-4B. Thus, in these embodiments, a first capacitor 305 (FIGS. 3A and 3B) can be electrically coupled to the electrical contacts 211 and 213 of the first instance of the electrical contacts 211-214 on the substrate 201, and a second capacitor 305 can be electrically coupled to the electrical contacts 211 and 213 of the second instance of the electrical contacts 211-214 on the substrate 201. In these and other embodiments, a first capacitor 405 (FIGS. 4A and 4B) can be electrically coupled to the electrical contacts 212 and 214 of the first instance of the electrical contacts 211-214 on the substrate 201, and a second capacitor 405 can be electrically coupled to the electrical contacts 212 and 214 of the second instance of the electrical contacts 211-214 on the substrate 201. In these and still other embodiments, a capacitor 305 can be electrically coupled to the electrical contacts 211 and 213 of the first instance of the electrical contacts 211-214 and/or the second instance of the electrical contacts 211-214 on the substrate 201, and/or a capacitor 405 can be electrically coupled to the electrical contacts 212 and 214 of the other of the first and/or second instances of the electrical contacts 211-214.

Figure 5:
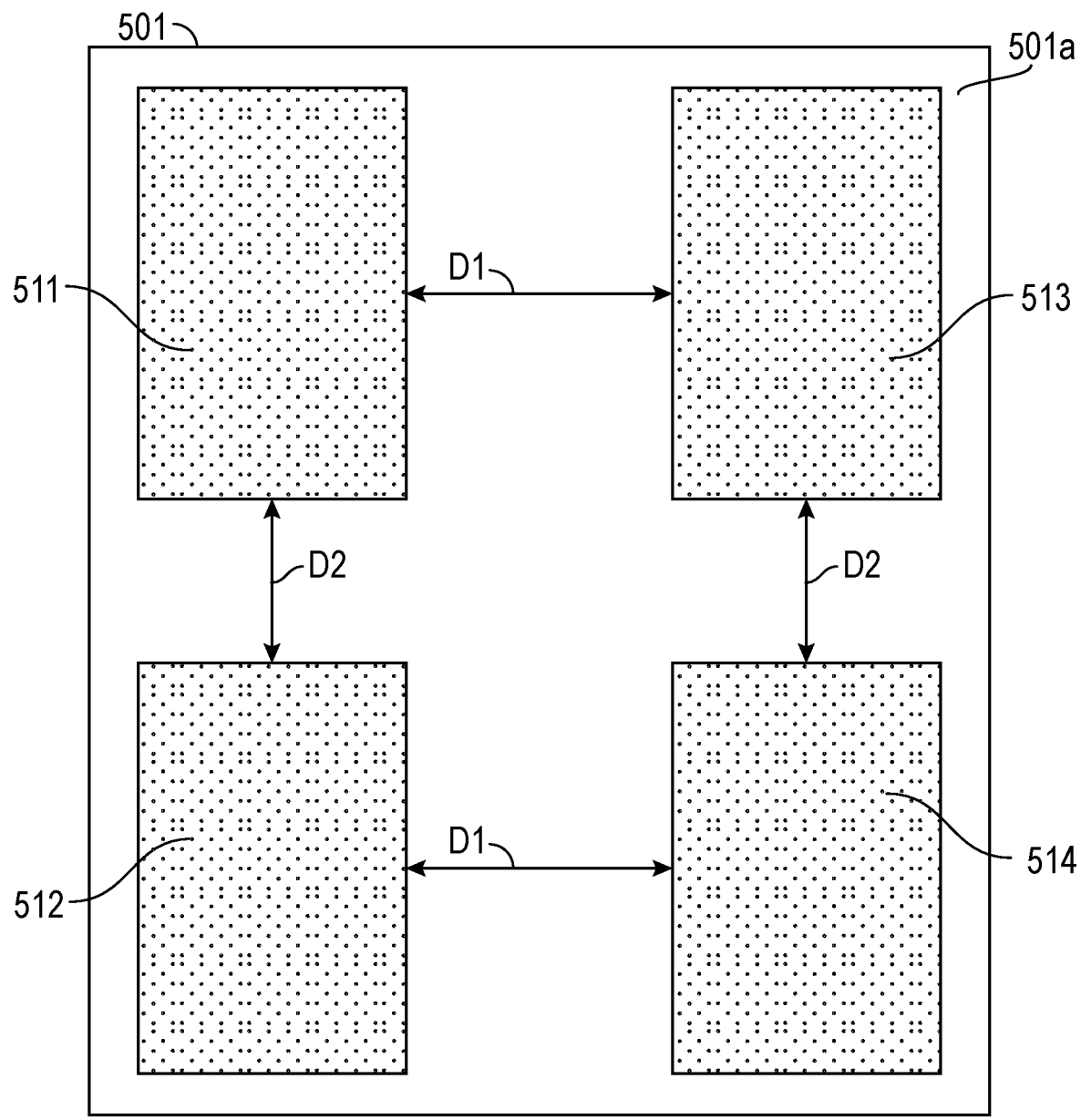
FIG. 5 is a top view of another substrate configured in accordance with various embodiments of the present technology.

FIG. 5 is a top view of another substrate 501 (e.g., the substrate 101 of FIG. 1) configured in accordance with various embodiments of the present technology. The substrate 501 includes a plurality of electrical contacts 511-514 disposed on, formed in or on, and/or exposed through a first side or surface 501a of the substrate 501. The electrical contacts 511-514 can be bond pads and/or other suitable electrical contacts. In some embodiments, the electrical contacts 511-514 can be solder mask defined or non-solder mask defined.

The electrical contacts 511 and 512 of FIG. 5 are separated from the electrical contacts 513 and 514, respectively, by a first space that is defined at least in part by a distance D1 between (a) the electrical contact 511 and the electrical contact 513 and/or (b) the electrical contact 512 and the electrical contact 514. The electrical contact 511 and the electrical contact 513 can form a first set or pair of electrical contacts, and/or the electrical contact 512 and the electrical contact 514 can form a second set or pair of electrical contacts. The first and second sets can correspond to capacitors (e.g., the capacitor 105 of FIG. 1 or another capacitor) having a footprint of a first (larger) size. For example, the first and second sets can correspond to 0402 capacitors. Continuing with this example, the first distance D1 can correspond at least in part to a first distance or spacing between electrical capacitor contacts of a 0402 capacitor.

The electrical contacts 511 and 513 of FIG. 5 are separated from the electrical contacts 512 and 514, respectively, by a second space that is defined at least in part by a distance D2 between (a) the electrical contact 511 and the electrical contact 512 and/or (b) the electrical contact 513 and the electrical contact 514. The electrical contact 511 and the electrical contact 512 can form a third set of electrical contacts, and/or the electrical contact 513 and the electrical contact 514 can form a fourth set of electrical contacts. The third and fourth sets can correspond to capacitors (e.g., the capacitor 105 of FIG. 1 or another capacitor) having a footprint of a second (smaller) size. For example, the third and fourth sets can correspond to 0201 capacitors. Continuing with this example, the second distance D2 can correspond at least in part to a second distance or spacing between electrical capacitor contacts of a 0201 capacitor.

In the illustrated embodiment, the first and second sets of electrical contacts include at least one electrical contact in common with the third and fourth sets of electrical contacts, respectively. For example, the first and third sets of electrical contacts both include the electrical contact 511, and the second and fourth sets of electrical contacts both include the electrical contact 514. Additionally, or alternatively, the first and second sets of electrical contacts can include at least one electrical contact in common with the fourth and third sets of electrical contacts, respectively. For example, the first and fourth sets of electrical contacts both include the electrical contact 513, and the second and third sets of electrical contacts both include the electrical contact 512.

In the illustrated embodiment, the electrical contacts 511-514 have a same or similar size to one another. In other embodiments, the sizes of the electrical contacts 511-514 can vary and/or can differ. In some embodiments, one or more electrical contacts of the first, second, third, and/or fourth sets can have a generally rectangular shape. The rectangular shape(s) can be characterized by a first lateral dimension (e.g., a dimension parallel to the arrow indicating the distance D2 in FIG. 5) and a second lateral dimension (e.g., a dimension parallel to the arrow indicating the distance D1 in FIG. 5) perpendicular to the first lateral dimension. The first lateral dimension and/or the second lateral dimension can correspond to a first and/or second respective widths of electrical capacitor contacts of a capacitor. For example, the first lateral direction of the electrical contact 511 can correspond to (i) a first respective width of an electrical capacitor contact of a first capacitor when the first capacitor is installed horizontally on the substrate 501 and electrically coupled to the electrical contacts 511 and 513, and/or (ii) a first respective width of an electrical capacitor contact of a second capacitor when the second capacitor is installed vertically on the substrate 501 and electrically coupled to the electrical contacts 511 and 512. Continuing with this example, the second lateral dimension of the electrical contact 511 can correspond to (i) a second respective width of the electrical capacitor contact of the first capacitor, and/or (ii) a second respective width of the electrical capacitor contact of the second capacitor.

In some embodiments, each of the electrical contacts 511-514 can be electrically connected to one of various voltages. For example, the electrical contacts 511 and/or 514 can be connected to a power supply voltage $V_{CC}$, $V_{CCQ}$, or $V_{CCQ2}$. In these and other embodiments, the electrical contacts 512 and/or 513 can be connected to a ground voltage $V_{SS}$. In these and still other embodiments, the electrical contacts 511 and/or 514 can be connected to a ground voltage $V_{SS}$, and/or the electrical contacts 512 and/or 513 can be connected to a power supply voltage $V_{CC}$, $V_{CCQ}$, or $V_{CCQ2}$. In a specific example, the electrical contact 511 is connected to the power supply voltage $V_{CCQ}$, the electrical contact 514 is connected to the power supply voltage $V_{CCQ2}$, and the electrical contacts 512 and 513 are connected to the ground voltage $V_{SS}$.

In some embodiments, some of the electrical contacts 511-514 can be electrically coupled to one another. In the specific example provided above, the electrical contacts 512 and 513 are both connected to the ground voltage $V_{SS}$. In this example, the electrical contacts 512 and 513 can be electrically coupled to one another using one or more electrical connectors (e.g., vias, traces, printed conductive lines, wire bonds, etc.) in accordance with the discussion above with respect to FIG. 2B. Alternatively, the electrical contacts 512 and 513 can be formed or defined by openings in a solder mask layer positioned on or over a common (e.g., single) conductive pad, as discussed above with respect to FIGS. 2A and 2B. As discussed above, coupling one of the electrical contacts 511-514 to another of the electrical contacts 511-514 can reduce the number and/or overall footprint of electrical connectors coupled to the electrical contacts 511-514. For example, instead of using a set of electrical connectors (e.g., vias, traces, etc.) electrically coupled to the electrical contact 512 and a separate set of electrical connectors (e.g., vias, traces, etc.) electrically coupled to the electrical contact 513, the same set of electrical connectors can be electrically coupled to both the electrical contact 512 and the electrical contact 513. In other embodiments, each of the electrical contacts 511-514 can be electrically isolated from one another, at least until one of the electrical contacts 511-514 is electrically coupled to another of the electrical contacts 511-514 via a capacitor (not shown) mounted on the substrate 501.

Figure 6:
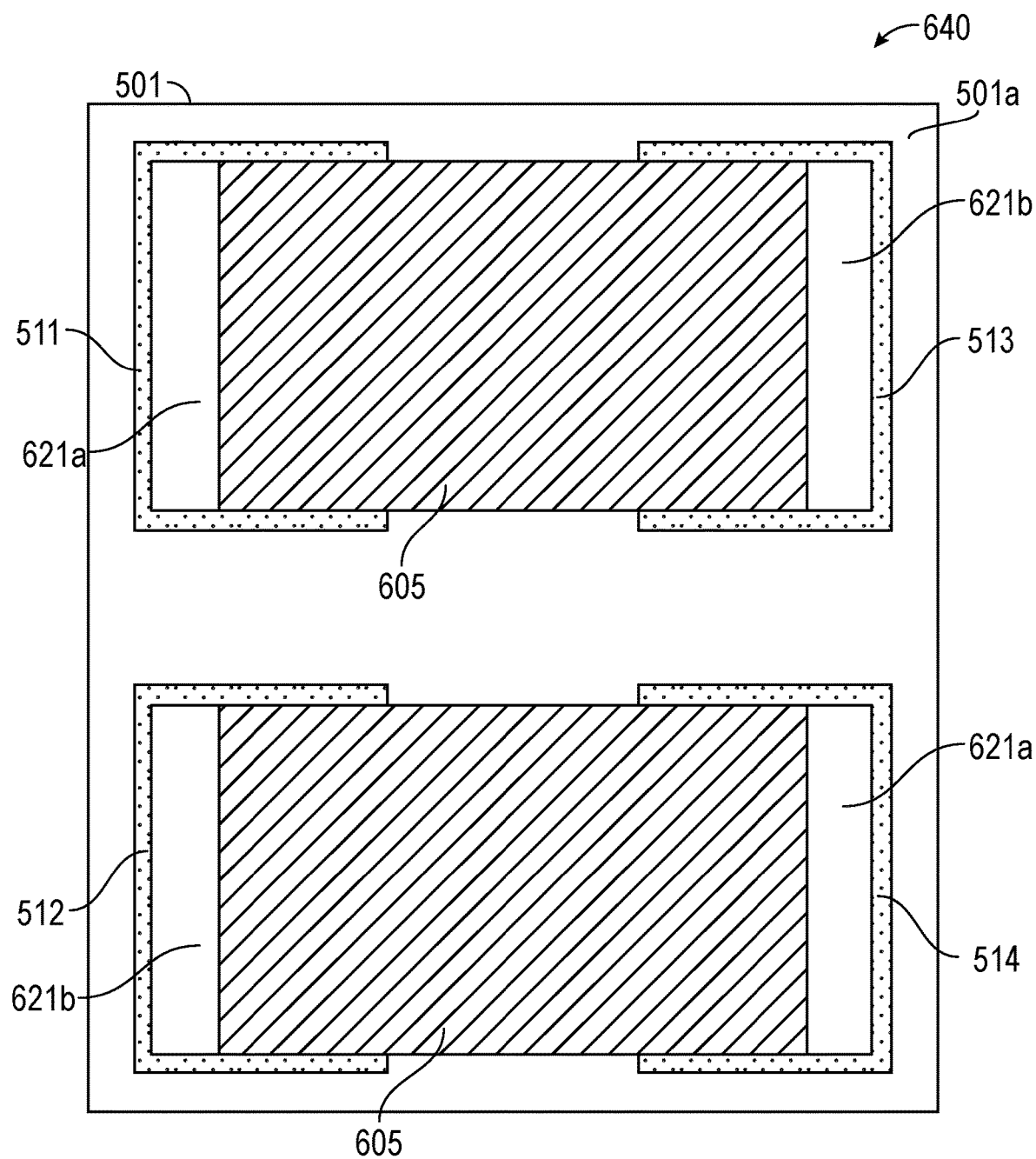
FIG. 6 is a top view of an arrangement including capacitors positioned over the substrate of FIG. 5, in accordance with various embodiments of the present technology.

FIG. 6 is a top view of an arrangement 640 including capacitors 605 positioned over (e.g., on) the substrate 501 of FIG. 5, in accordance with various embodiments of the present technology. One or both of the capacitors 605 can be the capacitor 105 of FIG. 1, the capacitor 305 of FIGS. 3A and 3B, and/or another capacitor. In some embodiments, the capacitors 605 can be 0402 capacitors.

As shown, the capacitors 605 each include a first electrical capacitor contact 621a (e.g., a first electrical terminal) and a second electrical capacitor contact 621b (e.g., a second electrical terminal). The first electrical capacitor contact 621a of the top capacitor 605 illustrated in FIG. 6 is aligned with and electrically coupled to the electrical contact 511 of the substrate 501. An electrical connector (not shown), such as a solder ball and/or another suitable electrical connector, can be used to facilitate the electrical connection between the first electrical capacitor contact 621a of the top capacitor 605 and the electrical contact 511. The second electrical capacitor contact 621b of the top capacitor 605 is aligned with and electrically coupled to the electrical contact 513. Another electrical connector (not shown), such as a solder ball and/or another suitable electrical connector, can be used to facilitate the electrical connection between the second electrical capacitor contact 621b of the top capacitor 605 and the electrical contact 513. Thus, the top capacitor 605 of FIG. 6 can be positioned in a generally horizontal or lateral orientation on the substrate 501.

Similarly, the first electrical capacitor contact 621a of the bottom capacitor 605 illustrated in FIG. 6 is aligned with and electrically coupled to the electrical contact 514 of the substrate 501. An electrical connector (not shown), such as a solder ball and/or another suitable electrical connector, can be used to facilitate the electrical connection between the electrical capacitor contact 621a of the bottom capacitor 605 and the electrical contact 514. The second electrical capacitor contact 621b of the bottom capacitor 605 is aligned with and electrically coupled to the electrical contact 512. Another electrical connector (not shown), such as a solder ball and/or another suitable electrical connector, can be used to facilitate the electrical connection between the second electrical capacitor contact 621b of the bottom capacitor 605 and the electrical contact 512. Thus, the bottom capacitor 605 of FIG. 6 can be positioned in a generally horizontal or lateral orientation on the substrate 501 and/or can be positioned on the substrate 501 such that it is generally parallel to (e.g., but oriented opposite to) the other (top) capacitor 605. In some embodiments, the capacitors 605 can be non-polarity devices such that it is of no consequence (a) to which of the electrical contacts 511 or 513 the first electrical capacitor contact 621a and/or the second electrical capacitor contact 621b is/are electrically coupled, and/or (b) to which of the electrical contacts 512 or 514 the first electrical capacitor contact 621a and/or the second electrical capacitor contact 621b is/are electrically coupled.

In some embodiments, either or both of the capacitors 605 can be a decoupling capacitor. For example, the electrical contact 511 can be electrically connected to a power supply voltage $V_{CCQ}$, and the electrical contact 513 can be electrically connect to a ground voltage $V_{SS}$. Continuing with this example, when the top capacitor 605 is electrically coupled to the electrical contacts 511 and 513, the top capacitor 605 can connect a first circuit branch to a second circuit branch and decouple the power supply voltage $V_{CCQ}$ from the ground voltage $V_{SS}$, thereby removing voltage fluctuations from the power supply signals. As another example, the electrical contact 514 can be electrically connected to a power supply voltage $V_{CCQ2}$, and the electrical contact 512 can be electrically connect to a ground voltage $V_{SS}$. Continuing with this example, when the bottom capacitor 605 is electrically coupled to the electrical contacts 512 and 514, the bottom capacitor 605 can connect a third circuit branch to a fourth circuit branch and decouple the power supply voltage $V_{CCQ2}$ from the ground voltage $V_{SS}$, thereby removing voltage fluctuations from the power supply signals. Continuing with the above examples, the second circuit branch can be the fourth circuit branch (e.g., when the electrical contacts 512 and 513 are electrically coupled to one another and/or comprise a common conductive pad covered by a solder mask).

Figure 7:
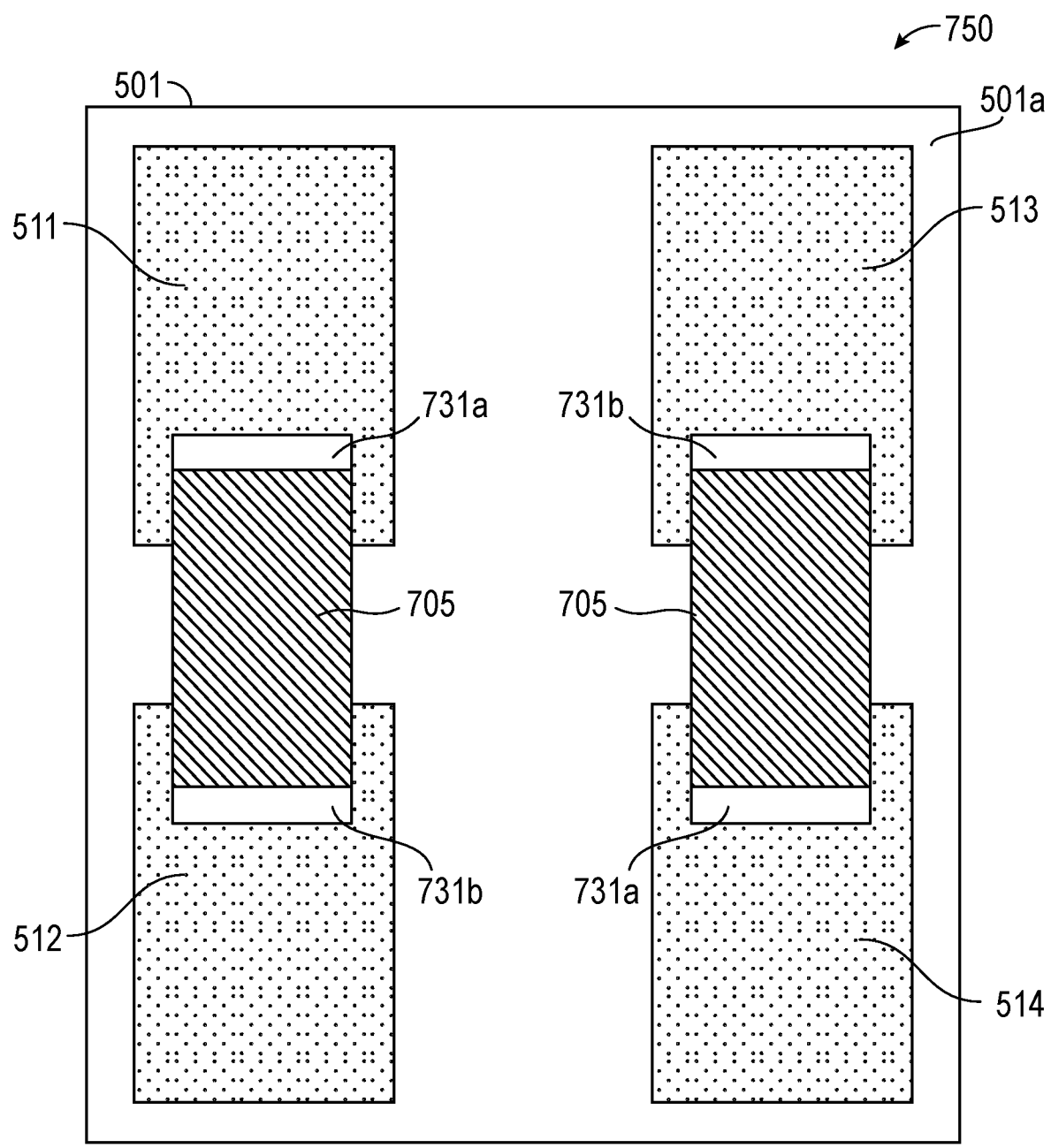
FIG. 7 is a top view of another arrangement including capacitors positioned over the substrate of FIG. 5, in accordance with various embodiments of the present technology.

FIG. 7 is a top view of another arrangement 750 including capacitors 705 positioned over (e.g., on) the substrate 501 of FIG. 5, in accordance with various embodiments of the present technology. One or both of the capacitors 705 can be the capacitor 105 of FIG. 1, the capacitor 405 of FIGS. 3A and 3B, and/or another capacitor. In some embodiments, the capacitors 705 can be 0201 capacitors.

As shown, the capacitors 705 each include a first electrical capacitor contact 731a (e.g., a first electrical terminal) and a second electrical capacitor contact 731b (e.g., a second electrical terminal). The first electrical capacitor contact 731a of the left capacitor 705 illustrated in FIG. 7 is aligned with and electrically coupled to the electrical contact 511 of the substrate 501. An electrical connector (not shown), such as a solder ball and/or another suitable electrical connector, can be used to facilitate the electrical connection between the first electrical capacitor contact 731a of the left capacitor 705 and the electrical contact 511. The second electrical capacitor contact 731b of the left capacitor 705 is aligned with and electrically coupled to the electrical contact 512. Another electrical connector (not shown), such as a solder ball and/or another suitable electrical connector, can be used to facilitate the electrical connection between the second electrical capacitor contact 731b of the left capacitor 705 and the electrical contact 512. Thus, in contrast with the capacitors 605 of FIG. 6, the left capacitor 705 of FIG. 7 can be positioned in a generally vertical orientation on the substrate 501.

Similarly, the first electrical capacitor contact 731a of the right capacitor 705 illustrated in FIG. 7 is aligned with and electrically coupled to the electrical contact 514 of the substrate 501. An electrical connector (not shown), such as a solder ball and/or another suitable electrical connector, can be used to facilitate the electrical connection between the first electrical capacitor contact 731a of the right capacitor 705 and the electrical contact 514. The second electrical capacitor contact 731b of the right capacitor 705 is aligned with and electrically coupled to the electrical contact 513. Another electrical connector (not shown), such as a solder ball and/or another suitable electrical connector, can be used to facilitate the electrical connection between the second electrical capacitor contact 731b of the right capacitor 605 and the electrical contact 513. Thus, the right capacitor 705 of FIG. 7 can be positioned in a generally vertical orientation on the substrate 501 and/or can be positioned on the substrate 501 such that it is generally parallel to (but oriented opposite to) the other (left) capacitor 705. Stated another way, the capacitors 705 can be positioned on the substrate 501 and electrically coupled to the electrical contacts 511-514 such that the capacitors 705 are positioned in an orientation generally perpendicular to the orientations of the capacitors 605 when the capacitors 605 are positioned on the substrate 501 and are electrically coupled to the electrical contacts 511-514. In some embodiments, the capacitors 705 can be non-polarity devices such that it is of no consequence (a) to which of the electrical contacts 511 or 512 the first electrical capacitor contact 731a and/or the second electrical capacitor contact 731b is/are electrically coupled, and/or (b) to which of the electrical contacts 513 or 514 the first electrical capacitor contact 731a and/or the second electrical capacitor contact 731b is/are electrically coupled.

In some embodiments, either or both of the capacitors 705 can be a decoupling capacitor. For example, the electrical contact 511 can be electrically connected to a power supply voltage $V_{CCQ}$, and the electrical contact 512 can be electrically connect to a ground voltage $V_{SS}$. Continuing with this example, when the left capacitor 705 is electrically coupled to the electrical contacts 511 and 512, the left capacitor 705 can connect a first circuit branch to a third circuit branch and decouple the power supply voltage $V_{CCQ}$ from the ground voltage $V_{SS}$, thereby removing voltage fluctuations from the power supply signals. As another example, the electrical contact 514 can be electrically connected to a power supply voltage $V_{CCQ2}$, and the electrical contacts 513 can be electrically connect to a ground voltage $V_{SS}$. Continuing with this example, when the right capacitor 705 is electrically coupled to the electrical contacts 513 and 514, the right capacitor 705 can connect a second circuit branch to a fourth circuit branch and decouple the power supply voltage $V_{CCQ2}$ from the ground voltage $V_{SS}$, thereby removing voltage fluctuations from the power supply signals. Continuing with the above examples, the second circuit branch can be the fourth circuit branch (e.g., when the electrical contacts 512 and 513 are electrically coupled to one another and/or comprise a common conductive pad covered by a solder mask).

Thus, the substrate 501 of FIGS. 5-7 is a hybrid substrate that can be used with one or more capacitors 605 having a larger footprint and/or with one or more capacitors 705 having a smaller footprint. For example, the electrical contacts 511-514 of the substrate 501 can be used with two capacitors 605 and/or with two capacitors 705. In other words, the same substrate 501 can be used for markets (e.g., automotive) that use capacitors (e.g., the capacitors 605 of FIG. 6) having larger footprints, as well as for markets (e.g., mobile) that use capacitors (e.g., the capacitors 705 of FIG. 7) having smaller footprints. This can (i) enable high volume manufacturing of the substrate 501 and/or of semiconductor devices (e.g., the semiconductor device 100 of FIG. 1) incorporating the substrate 501 and (ii) obviate the practice of manufacturing separate substrates for the different markets.

Although shown with a single instance of the electrical contacts 511-514, substrates 501 configured in accordance with other embodiments of the present technology can include multiple instances of the electrical contacts 511-514. For example, a substrate 501 configured in accordance with other embodiments of the present technology can include a first instance of the electrical contacts 511-514 in the arrangement illustrated in FIGS. 5-7 and a second, separate instance of the electrical contacts 511-514 in the arrangement illustrated in FIGS. 5-7. Thus, in these embodiments, a first capacitor 605 (FIG. 6) can be electrically coupled to the electrical contacts 511 and 513 of the first instance of the electrical contacts 511-514 on the substrate 501, a second capacitor 605 can be electrically coupled to the electrical contacts 512 and 514 of the first instance of the electrical contacts 511-514, a third capacitor 605 can be electrically coupled to the electrical contacts 511 and 513 of the second instance of the electrical contacts 511-514 on the substrate 501, and a fourth capacitor 605 can be electrically coupled to the electrical contacts 512 and 514 of the second instance of the electrical contacts 511-514. In these and other embodiments, a first capacitor 705 (FIG. 7) can be electrically coupled to the electrical contacts 511 and 512 of the first instance of the electrical contacts 511-514 on the substrate 501, a second capacitor 705 can be electrically coupled to the electrical contacts 513 and 514 of the first instance of the electrical contacts 511-514, a third capacitor 705 can be electrically coupled to the electrical contacts 511 and 512 of the second instance of the electrical contacts 511-514 on the substrate 501, and a fourth capacitor 705 can be electrically coupled to the electrical contacts 513 and 514 of the second instance of the electrical contacts 511-514. In these and still other embodiments, a first capacitor 605 can be electrically coupled to the electrical contacts 511 and 513 of the first instance of the electrical contacts 511-514 on the substrate 501, a second capacitor 605 can be electrically coupled to the electrical contacts 512 and 514 of the first instance of the electrical contacts 511-514, a first capacitor 705 can be electrically coupled to the electrical contacts 511 and 512 of the second instance of the electrical contacts 511-514 on the substrate 501, and a second capacitor 705 can be electrically coupled to the electrical contacts 513 and 514 of the second instance of the electrical contacts 511-514.

In some embodiments, the substrate 501 can include additional electrical contacts than shown in FIGS. 5-7. For example, the substrate 501 can include electrical contacts positioned between (i) the electrical contacts 511 and 512 and/or (ii) the electrical contacts 513 and 514. As a specific example, a set of electrical contacts (e.g., similar to the electrical contacts 212 and 214 of FIGS. 2A-4B) can be positioned between the electrical contacts 511 and 513, and/or another set of electrical contacts (e.g., similar to the electrical contacts 212 and 214) can be positioned between the electrical contacts 512 and 514. In such embodiments, the electrical contacts 511-514 can be similar to the electrical contacts 211 and 213 of FIGS. 2A-4B. For example, two instances of the arrangement of electrical contacts 211-214 illustrated in FIGS. 2A-4B can be used to form an arrangement similar to the arrangement of electrical contacts 511-514 illustrated in FIGS. 5-7.

In some embodiments, the substrate 501 can include fewer electrical contacts than shown in FIGS. 5-7. For example, the substrate 501 can omit the electrical contact 514. The electrical contact 512 can be separated from the electrical contact 511 by the first distance D1 or by the second distance D2. Additionally, or alternatively, the electrical contact 511 can be separated from the electrical contact 513 by the first distance D1 or by the second distance D2. The electrical contact 512 can be located at the position illustrated in FIG. 5 (e.g., below the electrical contact 511). In other embodiments, the electrical contact 512 can be located at a different position, such as above or to the left of the electrical contact 511 illustrated in FIG. 5.

The electrical contact 511 and the electrical contact 513 can form a first pair of electrical contacts configured to receive a first surface-mount capacitor, and the electrical contact 511 and the electrical contact 512 can form a second pair of electrical contacts configured to receive a second surface-mount capacitor. The electrical contact 511 can be connected to a first potential, the electrical contact 512 can be connected to a second potential, and the electrical contact 513 can be connected to a third potential. The second potential and the third potential can be the same or different. For example, the first potential can be one of $V_{CCQ}$ or $V_{SS}$, and the second and third potentials can be the other of $V_{CCQ}$ or $V_{SS}$. As another example, the first potential can be $V_{SS}$, the second potential can be $V_{CCQ}$, and the third potential can be $V_{CCQ2}$.

The first surface-mount capacitor and the second surface-mount capacitor can be similar or different. The first pair of electrical contacts can be electrically coupled to the first surface-mount capacitor while the second pair of electrical contacts is electrically coupled to the second surface-mount capacitor. In these and other embodiments, the first pair of electrical contacts can be electrically coupled to the first surface-mount capacitor while (e.g., only when) the second pair of electrical contacts is not electrically coupled to the second surface-mount capacitor. In these and still other embodiments, the second pair of electrical contacts can be electrically coupled to the second surface-mount capacitor while (e.g., only when) the first pair of electrical contacts is not electrically coupled to the first surface-mount capacitor.

Figure 8:
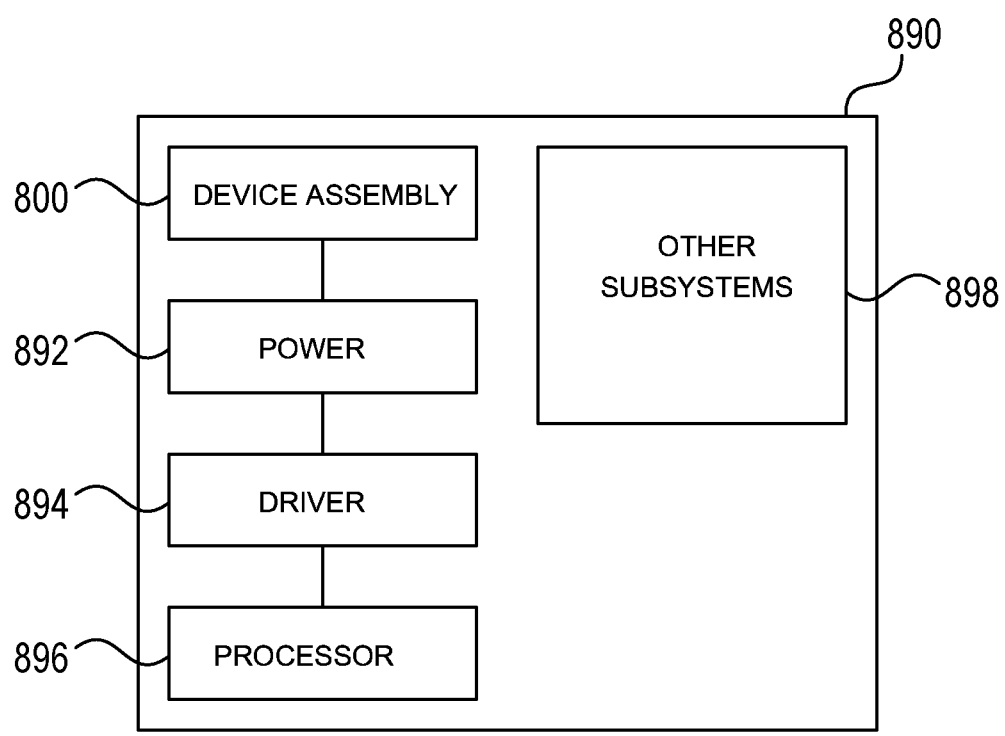
FIG. 8 is a schematic view of a system that includes a semiconductor device configured in accordance with an embodiment of the present technology.

Any of the semiconductor devices, capacitors, and/or substrates described above with reference to FIGS. 1-7 can be incorporated into any of a myriad of larger and/or more complex systems, a representative example of which is system 890 shown schematically in FIG. 8. The system 890 can include a semiconductor device assembly 800, a power source 892, a driver 894, a processor 896, and/or other subsystems or components 898. The semiconductor device assembly 800 can include semiconductor devices with features generally similar to those of the semiconductor devices, capacitors, and/or substrates described above. The resulting system 890 can perform any of a wide variety of functions, such as memory storage, data processing, and/or other suitable functions. Accordingly, representative systems 890 can include, without limitation, hand-held devices (e.g., mobile phones, tablets, digital readers, and digital audio players), computers, and appliances. Components of the system 890 may be housed in a single unit or distributed over multiple, interconnected units (e.g., through a communications network). The components of the system 890 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any materials incorporated herein by reference conflict with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. As used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:
1. A substrate, comprising:
 a first pair of electrical contacts on a first surface of the substrate and configured to receive a first surface-mount capacitor to connect a first circuit branch to a second circuit branch, the first pair of electrical contacts spaced apart by a first space corresponding to a first distance between capacitor contacts of the first surface-mount capacitor; and a second pair of electrical contacts on the first surface of the substrate and configured to receive a second surface-mount capacitor to connect the first circuit branch to the second circuit branch, the second pair of electrical contacts spaced apart by a second space corresponding to a second distance between capacitor contacts of the second surface-mount capacitor, wherein the second pair of electrical contacts is at least partially positioned within the first space.

2. The substrate of claim 1, wherein a first electrical contact of the first pair and a third electrical contact of the second pair are electrically connected to the first circuit branch, and wherein a second electrical contact of the first pair and a fourth electrical contact of the second pair are electrically connected to the second circuit branch.

3. The substrate of claim 2, wherein the first electrical contact and the third electrical contact comprise a first common conductive pad covered by a solder mask with a first opening corresponding to the first electrical contact and a third opening corresponding to the third electrical contact, and wherein the second electrical contact and the fourth electrical contact comprise a second common conductive pad covered by the solder mask with a second opening corresponding to the second electrical contact and a fourth opening corresponding to the fourth electrical contact.

4. The substrate of claim 2, further comprising:
a first via extending into the substrate directly from the first electrical contact;
a second via extending into the substrate directly from the third electrical contact; and
a trace extending directly between the first via and the second via,
wherein the first via, the second via, and the trace electrically couple the first electrical contact to the third electrical contact.

5. The substrate of claim 1, wherein:
the first pair of electrical contacts is disposed on the first surface of the substrate such that the first surface-mount capacitor is positioned in a first orientation over the substrate when the capacitor contacts of the first surface-mount capacitor are electrically coupled to respective electrical contacts of the first pair of electrical contacts;
the second pair of electrical contacts is disposed on the first surface of the substrate such that the second surface-mount capacitor is positioned in a second orientation over the substrate when the capacitor contacts of the second surface-mount capacitor are electrically coupled to respective electrical contacts of the second pair of electrical contacts; and
the second orientation is generally perpendicular to the first orientation.

6. The substrate of claim 1, wherein:
the first pair of electrical contacts is disposed on the first surface of the substrate such that the first surface-mount capacitor is positioned in a first orientation over the substrate when the capacitor contacts of the first surface-mount capacitor are electrically coupled to respective electrical contacts of the first pair of electrical contacts;
the second pair of electrical contacts is disposed on the first surface of the substrate such that the second surface-mount capacitor is positioned in a second orientation over the substrate when the capacitor contacts of the second surface-mount capacitor are electrically coupled to respective electrical contacts of the second pair of electrical contacts; and
the second orientation is generally parallel to the first orientation.

7. The substrate of claim 1, wherein the first pair of electrical contacts is disposed on the first surface of the substrate such that the first surface-mount capacitor is positioned over at least a portion of electrical contacts of the second pair of electrical contacts when the capacitor contacts of the first surface-mount capacitor are electrically coupled to respective electrical contacts of the first pair of electrical contacts.

8. The substrate of claim 1, wherein:
the first space is larger than the second space; or
the first distance is larger than the second distance.

9. The substrate of claim 1, wherein the first surface-mount capacitor is a 0402 capacitor and the second surface-mount capacitor is a 0201 capacitor.

* * * * *